(12) United States Patent  
Cheong et al.

(10) Patent No.: US 6,603,143 B2  
(45) Date of Patent: Aug. 5, 2003

(54) SEMICONDUCTOR DEVICE AND METHOD FOR FABRICATING SAME

(75) Inventors: Yeon Woo Cheong, Kyongsangnam-do (KR); Young Kum Back, Kyongsangnam-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 10/242,765

(22) Filed: Sep. 13, 2002

(65) Prior Publication Data

US 2003/0013256 A1 Jan. 16, 2003

Related U.S. Application Data

(62) Division of application No. 09/517,777, filed on Mar. 2, 2000, now Pat. No. 6,472,277.

(30) Foreign Application Priority Data

Mar. 18, 1999 (KR) .......................................... 9235/1999

(51) Int. Cl.⁷ .......................... H01L 29/78; H01L 33/00
(52) U.S. Cl. ........................ 257/57; 257/66; 257/347
(58) Field of Search .............................. 257/347, 57, 66

(56) References Cited

U.S. PATENT DOCUMENTS

| 4,984,041 A | * | 1/1991 | Hack et al. |
| 5,182,619 A | | 1/1993 | Pfiester ........................ 257/382 |
| 5,453,635 A | | 9/1995 | Hsu ............................ 257/336 |
| 5,798,278 A | | 8/1998 | Chan ............................ 437/43 |
| 6,100,146 A | | 8/2000 | Gardener ..................... 438/301 |
| 6,200,841 B1 | | 3/2001 | Kim ............................ 438/197 |
| 6,218,315 B1 | | 4/2001 | Ballamine ................... 438/778 |

FOREIGN PATENT DOCUMENTS

| EP | 0487101 A2 | * | 5/1992 |
| EP | 0913860 A2 | * | 5/1999 |

* cited by examiner

*Primary Examiner*—Stephen D. Meier  
(74) *Attorney, Agent, or Firm*—Morgan, Lewis & Bockius LLP

(57) ABSTRACT

A semiconductor device includes a semiconductor substrate having a trench in its surface, an insulating film in the trench, a doped conductive layer on the insulating film, a gate insulation film and a gate electrode on the doped conductive layer over the trench, and source and drain impurity regions in the surface of the semiconductor substrate at sides of the gate electrode.

14 Claims, 7 Drawing Sheets

SEMICONDUCTOR DEVICE AND METHOD FOR FABRICATING SAME

This is a divisional of application Ser. No. 09/517,777 filed on Mar. 2, 2000, now U.S. Pat. No. 6,472,277.

This application claims the benefit of Korean patent application No. 9235/1999, filed Mar. 18, 1999, which is hereby incorporated by reference.

BACKGROUND OF THE INVENTION

1. Field of the Invention

The present invention relates to a semiconductor device, and more particularly, to a semiconductor device and a method for fabricating the same with an improved short channel effect and reduced punch-through caused during channel formation.

2. Discussion of the Related Art

A related art semiconductor device and method for fabricating the same will be explained with reference to the attached drawings.

Referring to FIG. 1, a related art semiconductor device includes a semiconductor substrate 11, a gate insulating film 12 on the semiconductor substrate 11, and a gate electrode 13a on the gate insulating film 12. Insulating sidewalls 16 are formed at both sides of the gate electrode 13a, and source and drain impurity regions 17 of an LDD (Lightly Doped Drain) structure are formed in a surface of the semiconductor substrate 11 on both sides of the gate electrode 13a.

FIGS. 2A–2D illustrate cross-sections showing a related art method for fabricating the semiconductor device of FIG. 1.

Referring to FIG. 2A, the related art method for fabricating a semiconductor device first forms the gate insulating film 12 and a polysilicon film 13 on the semiconductor substrate 11. A photoresist 14 is coated on the polysilicon film 13, and subjected to patterning after exposure and development, to define a gate region.

As shown in FIG. 2B, the patterned photoresist 14 is used as a mask to selectively remove the polysilicon film 13 and the gate insulating film 12, forming the gate electrode 13a.

As shown in FIG. 2C, the patterned photoresist 14 is removed, and the gate electrode 13a is used as a mask when n-type impurity ions are doped into an entire surface of the semiconductor substrate 11, forming LDD regions 15 in the surface of the semiconductor substrate 11 at both sides of the gate electrode 13a.

As shown in FIG. 2D, an insulating film is formed on an entire surface of the semiconductor substrate 11, including the gate electrode 13a, and etched back, forming the insulating sidewalls 16 at both sides of the gate electrode 13a. Then, the gate electrode 13a and the insulating sidewalls 16 are used as a mask to heavily dope n-type impurity ions into the entire surface of the semiconductor substrate 11, forming the source and drain impurity regions 17 in the surface of the semiconductor substrate 11 on both sides of the gate electrode 13a.

However, the related art semiconductor device and the method for fabricating the same have the following problem. Due to higher density of devices, a channel becomes shorter following a scaling-down of the gate electrode. DIBL (Drain Induced Barrier Lowering) characteristic of the transistor is significantly lowered, which likely generates an electron punch-through.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same that improve the short channel effect, as well as to reduce punch-through caused during channel formation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a semiconductor device including a semiconductor substrate having a trench in its surface, an insulating film in the trench, a doped conductive layer on the insulating film, a gate insulation film and a gate electrode on the doped conductive layer over the trench, and source and drain impurity regions in the surface of the semiconductor substrate at sides of the gate electrode.

In another aspect of the present invention, there is provided a method for fabricating a semiconductor device, the method including the steps of forming a first trench in a surface of a semiconductor substrate, burying an insulating film in the first trench, selectively removing the insulating film to form a second trench in the surface of the semiconductor substrate, burying a doped conductive layer in the second trench, forming a gate insulation film and a gate electrode on the doped conductive layer, and forming source and drain impurity regions in the surface of the semiconductor substrate at sides of the gate electrode.

In another aspect of the present invention, there is provided a semiconductor device including a semiconductor substrate, a trench in a surface of the semiconductor substrate, an insulating layer over the trench, a doped polysilicon layer on the insulating layer, a gate insulation layer on the doped polysilicon layer over the trench, a gate electrode on the doped polysilicon layer, and source and drain impurity regions in the surface of the semiconductor substrate at sides of the gate electrode.

In another aspect of the present invention, there is provided a method for fabricating a semiconductor device, the method including the steps of forming a first trench in a surface of a semiconductor substrate, forming an insulating layer in the first trench, selectively removing the insulating layer to form a second trench in the surface of the semiconductor substrate, forming a doped polysilicon layer in the second trench, forming a gate insulation layer and a gate electrode on the doped polysilicon layer, and forming source and drain impurity regions in the surface of the semiconductor substrate at sides of the gate electrode.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENT

Reference will now be made in detail to the preferred embodiments of the present invention, examples of which are illustrated in the accompanying drawings.

Figure 1:
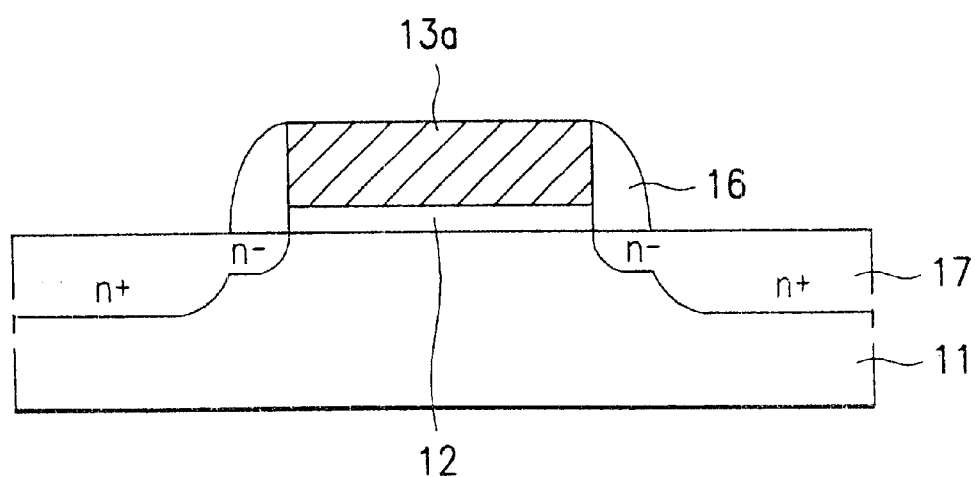
FIG. 1 illustrates a cross-section of a related art semiconductor device.
Figure 2A:
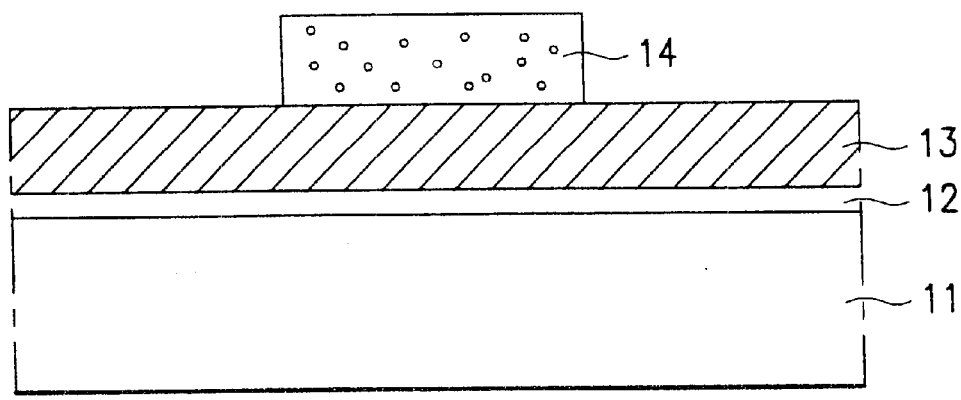
FIGS. 2A–2D illustrate cross-sections showing the steps of a related art method for fabricating a related out semiconductor device.
Figure 2B:
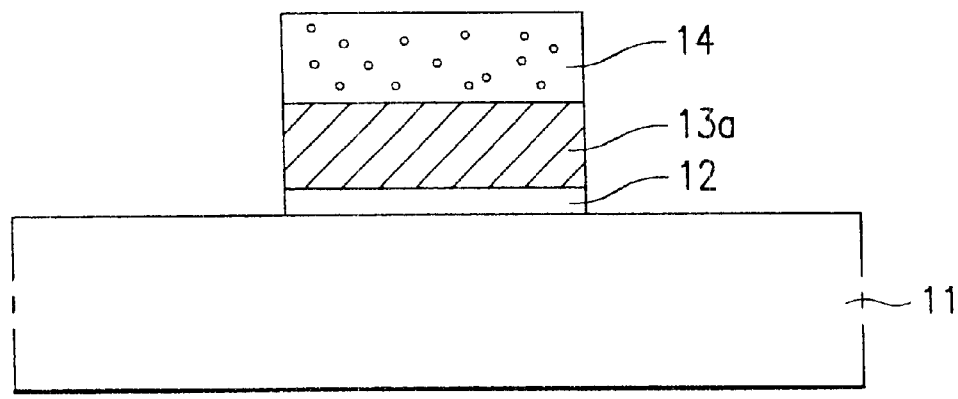
Figure 2C:
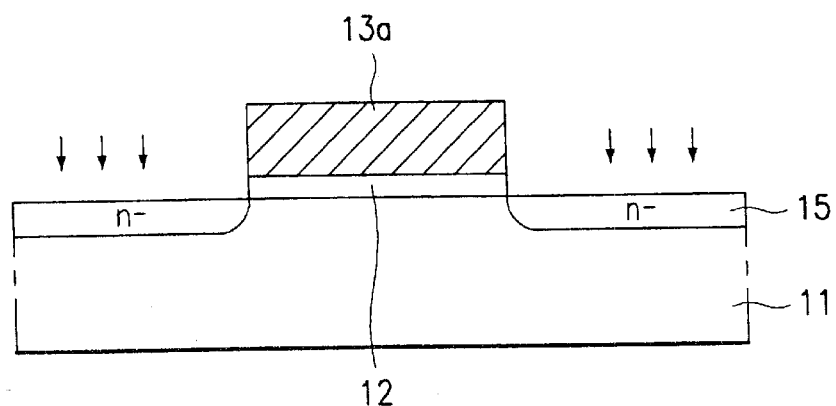
Figure 2D:
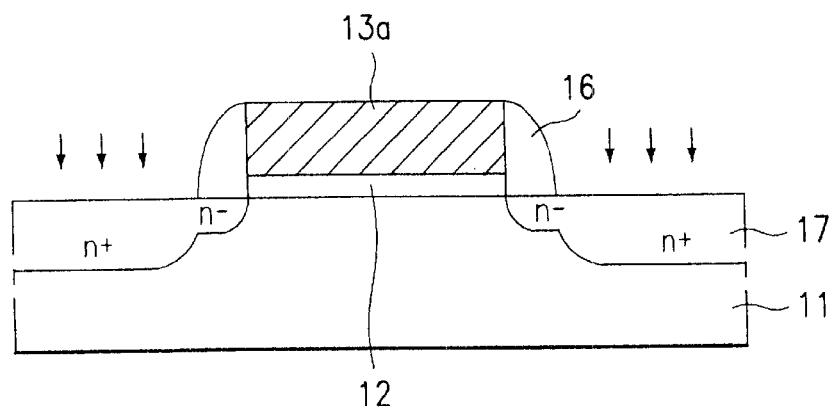
Figure 3:
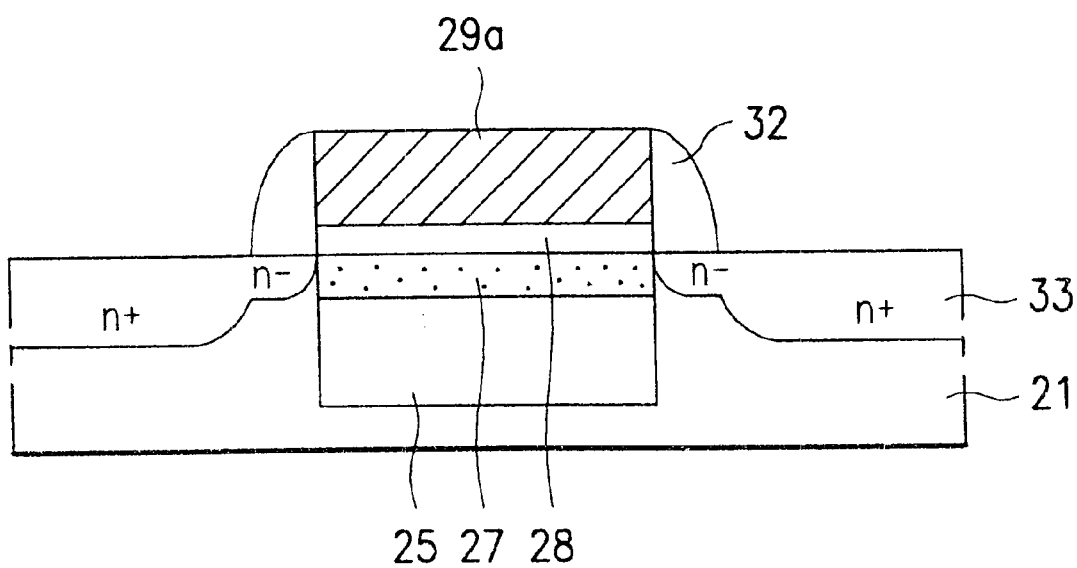
FIG. 3 illustrates a cross-section of a semiconductor device in accordance with a preferred embodiment of the present invention.

Referring to FIG. 3, a semiconductor device in accordance with a preferred embodiment of the present invention includes a gate electrode 29a formed over a gate insulating film 28 and over a region of a semiconductor substrate 21. A doped polysilicon layer 27 is formed under the gate electrode 29a up to a surface of the semiconductor substrate 21. A second insulating film 25 is beneath the doped polysilicon layer 27. Insulating sidewalls 32 are at both sides of the gate electrode 29a. Source and drain impurity regions 33 of an LDD structure are formed in a surface of the semiconductor substrate 21 at both sides of the gate electrode 29a. The doped polysilicon layer 27 is a channel region of a transistor, with channel depth based on a thickness of the doped polysilicon layer 27.

FIGS. 4A–4H illustrate cross-sections of a method of fabricating a semiconductor device in accordance with the preferred embodiment of the present invention.

Figure 4A:
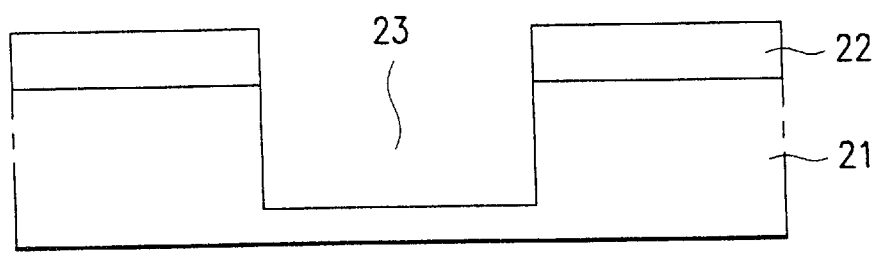
FIGS. 4A–4H illustrate cross-sections of the steps of a method for fabricating a semiconductor device in accordance with a preferred embodiment of the present invention.

Referring to FIG. 4A, a first insulating film 22 is formed on the semiconductor substrate 21, and selectively etched to expose a portion of the semiconductor substrate 21. The first insulating film 22 is formed of an oxide, a nitride, or a stack of an oxide and a nitride. Then, the first insulating film 22 is used as a mask to selectively remove a portion of the exposed semiconductor substrate 21, forming a first trench 23.

Figure 4B:
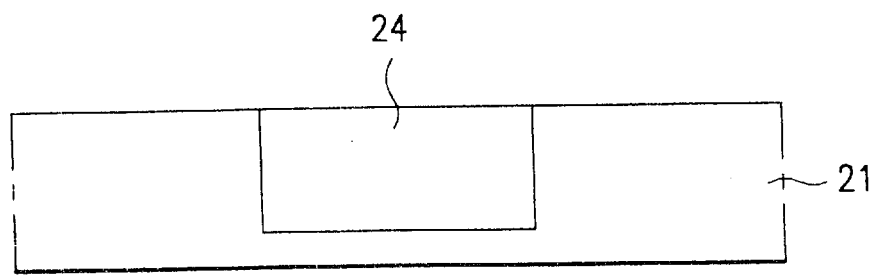

As shown in FIG. 4B, the first insulating film 22 is removed, and the second insulating film 24 is formed on an entire surface of the semiconductor substrate 21, including the first trench 23, and planarized by CMP (Chemical Mechanical Polishing) or etched back, leaving the second insulating film 24 only in the first trench 23. The second insulating film 24 may be formed of an oxide or a nitride.

Figure 4C:
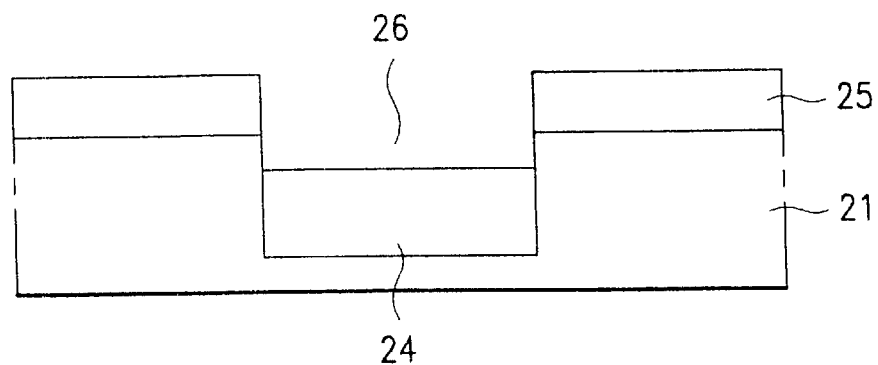

As shown in FIG. 4C, a third insulating film 25 is formed on an entire surface of the semiconductor substrate 21 and subjected to photolithography and etching, selectively removing the third insulating film 25 to expose a surface of the second insulating film 24. The third insulating film 25 may be formed of an oxide, a nitride, or a stack of an oxide and a nitride. Then, the third insulating film 25 is used as a mask to selectively remove the second insulating film 24, forming a second trench 26. A channel region will be formed in the portion selectively removed from the second insulating film 24.

Figure 4D:
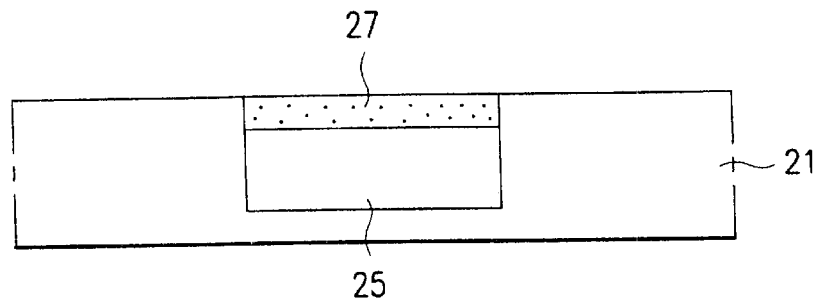

As shown in FIG. 4D, the third insulating film 25 is removed, and the doped polysilicon layer 27 is formed on an entire surface of the semiconductor substrate 21 including the second trench 26. P-type impurity doped polysilicon is used as the doped polysilicon layer 27 to fabricate an NMOS transistor, and N-type impurity doped polysilicon is used to fabricate a PMOS transistor as the doped polysilicon layer 27. Alternatively, undoped polysilicon may be used, and N-type or P-type impurity ions may be doped thereafter. A planarization is conducted by CMP or etching back, to leave the doped polysilicon layer 27 only in the second trench 26. The doped polysilicon layer 27 remaining in the second trench 26 is used as the channel region. Therefore, a depth of the channel region can be adjusted freely according to a depth of the second trench 26.

Figure 4E:
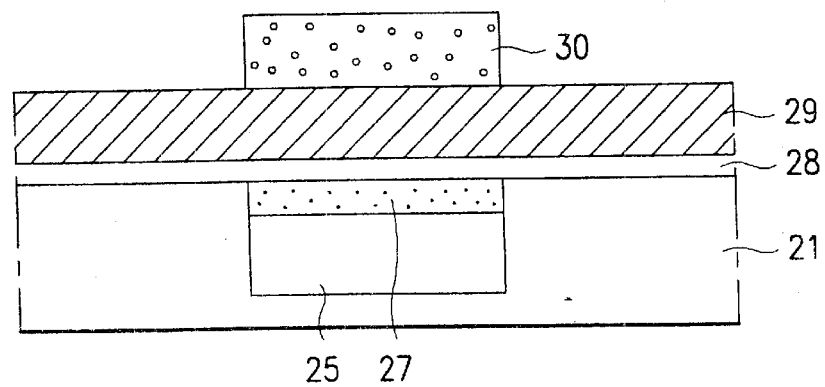

As shown in FIG. 4E, the gate insulating film 28 is formed on the semiconductor substrate 21, and the second polysilicon layer 29 (for a gate electrode) is formed on the gate insulating film 28. Then, a photoresist 30 is coated on the second polysilicon layer 29, and subjected to patterning after exposure and development, leaving the photoresist 30 only over the first and second trenches 23 and 26, thus defining a gate region.

Figure 4F:
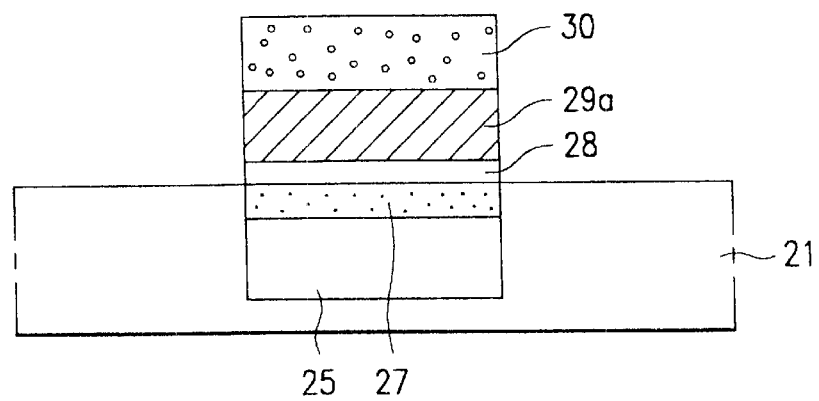

As shown in FIG. 4F, the patterned photoresist 30 is used as a mask to selectively remove the second polysilicon layer 29 and the gate insulating film 28, forming a gate electrode 29a.

Figure 4G:
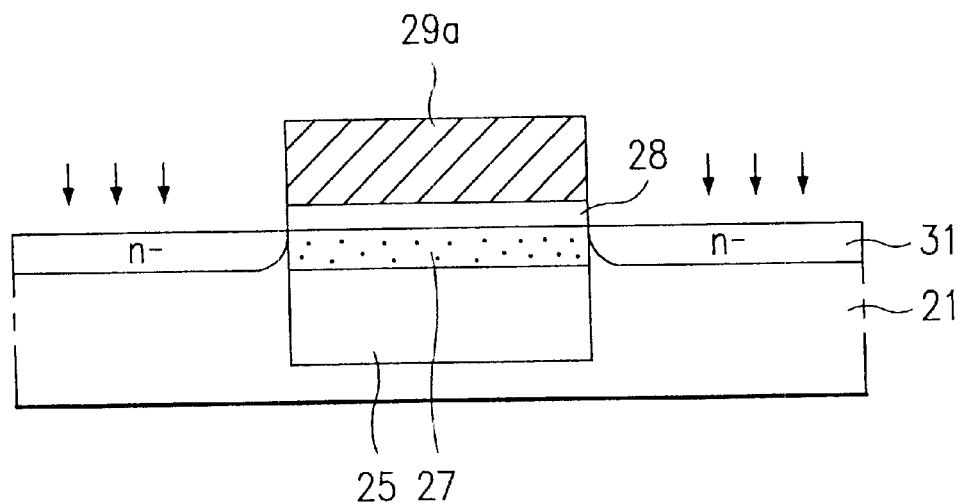

As shown in FIG. 4G, the photoresist 30 is removed, and the gate electrode 29a is used as a mask in lightly doping n-type impurity ions into an entire surface of the semiconductor substrate 21, forming LDD regions 31 in the surface of the semiconductor substrate 21 on both sides of the gate electrode 29a.

Figure 4H:
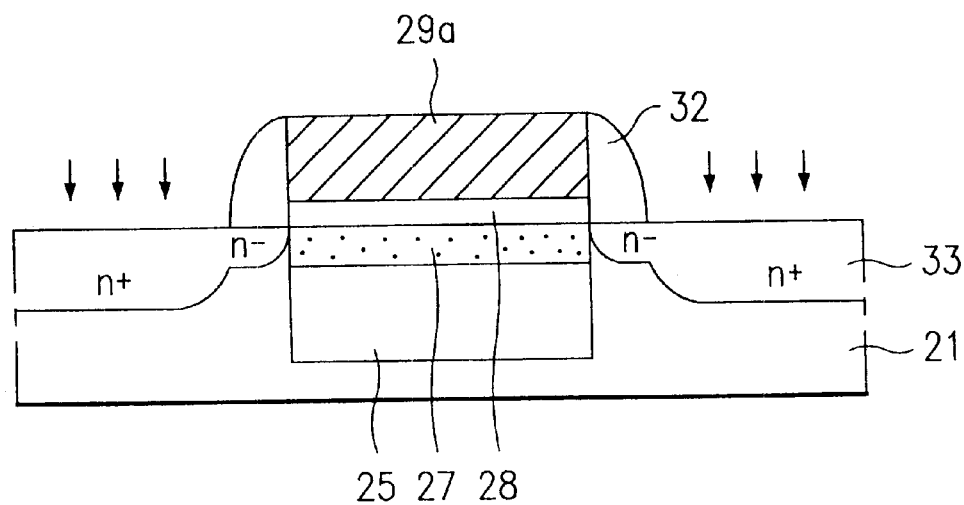

As shown in FIG. 4H, an insulating film is formed on the entire surface of the semiconductor substrate 21, including the gate electrode 29a, and etched back to form insulating sidewalls 32 at both sides of the gate electrode 29a. Then, the gate electrode 29a and the insulating sidewalls 32 are used as a mask in heavily doping n-type impurity ions into the entire surface of the semiconductor substrate 21, forming source and drain impurity regions 33 of an LDD structure in the surface of the semiconductor substrate 21 on both sides of the gate electrode 29a.

The semiconductor device and the method for fabricating the same of the present invention have the following advantages.

First, the provision of an insulating film between a source and a drain in a substrate improves the short channel effect.

Second, a depth of a channel region can be freely adjusted.

Third, the occurrence of punch-through caused by a depletion layer between a source and a drain during channel formation can be prevented.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor device comprising:
   a semiconductor substrate having a trench in its surface;
   an insulating film in the trench;
   a doped conductive layer on the insulating film;
   a gate insulation film and a gate electrode on the doped conductive layer over the trench; and
   source and drain impurity regions in the surface of the semiconductor substrate at sides of the gate electrode.

2. The semiconductor device of claim 1, wherein the source and drain impurity regions form a lightly doped drain (LDD) structure.

3. The semiconductor device of claim 1, wherein the insulating film is below a surface of the semiconductor substrate.

4. The semiconductor device of claim 1, wherein the doped conductive layer is level with a surface of the semiconductor substrate.

5. The semiconductor device of claim 1, further including insulating sidewalls formed at the sides of the gate electrode.

6. The semiconductor device of claim 1, wherein the doped conductive layer is formed of polysilicon.

7. The semiconductor device of claim 1, wherein the doped conductive layer comprises a channel region.

8. The semiconductor device of claim 1, wherein the insulating film is formed of one of an oxide and a nitride.

9. A semiconductor device comprising:

a semiconductor substrate;

a trench in a surface of the semiconductor substrate;

an insulating layer over the trench;

a doped polysilicon layer on the insulating layer;

a gate insulation layer on the doped polysilicon layer over the trench;

a gate electrode on the doped polysilicon layer; and source and drain impurity regions in the surface of the semiconductor substrate at sides of the gate electrode.

10. The semiconductor device of claim 9, wherein the source and drain impurity regions form a lightly doped drain (LDD) structure.

11. The semiconductor device of claim 9, wherein the insulating layer is entirely below the surface of the semiconductor substrate.

12. The semiconductor device of claim 9, wherein the doped polysilicon layer is level with the surface of the semiconductor substrate.

13. The semiconductor device of claim 9, further including insulating sidewalls formed at the sides of the gate electrode.

14. The semiconductor device of claim 9, wherein the insulating layer is formed of one of an oxide and a nitride.

* * * * *